United States Patent [19]

Darringer et al.

[11] Patent Number: 4,703,435

[45] Date of Patent: Oct. 27, 1987

[54] LOGIC SYNTHESIZER

[75] Inventors: John A. Darringer, Mahopac; William H. Joyner, Jr., Katonah, both of N.Y.

[73] Assignee: International Business Machines Corporation, Armonk, N.Y.

[21] Appl. No.: 631,364

[22] Filed: Jul. 16, 1984

[51] Int. Cl.$^4$ .................. G06F 7/00; G06F 15/60
[52] U.S. Cl. .................................. 364/489; 364/300; 364/488
[58] Field of Search ............... 364/488, 489, 490, 491, 364/300; 307/303

[56] References Cited

U.S. PATENT DOCUMENTS

| | | | |
|---|---|---|---|
| 4,377,849 | 3/1983 | Finger et al. | 364/491 |
| 4,580,228 | 4/1986 | Noto | 364/300 X |
| 4,591,993 | 5/1986 | Griffin et al. | 364/491 |
| 4,612,618 | 9/1986 | Pryor et al. | 364/488 X |

FOREIGN PATENT DOCUMENTS 0168650  1/1986  European Pat. Off. .

OTHER PUBLICATIONS

Friedman et al., "Methods used in an Automatic Logic Design Generator (Alert)", IEEE Trans. Comp. C-18, pp. 593-614, 1969.
Mitchell et al., "The Use of High Speed Proms to Generate Boolean Functions,", Wescon Technical Papers, Sep. 1978, pp. 1-7.
Mano, "Digital Logic and Computer Design", Ch. 3, pp. 72-103, 1979.
Introduction to the Automated Synthesis of Computer; Herbert Schorr; Department of Electrical Engineering Digital Systems.
Laboratory Technical Report No. 16 (Mar. 1962). Ph.D. Thesis, Princeton University.
Minimization of Boolean Functions; F. J. Hill et al.; "Introduction to Switch Theory and Logical Design", 1973.
The Description, Simulation, and Automatic Implementation of Digital Computer Processors; John A. Darringer.
The Experimental Compiling System; F. E. Allen; IBM J. Res. Development; vol. 24, No. 6, Nov. 1980.
Logic Synthesis Through Local Transformation; John A. Darringer; IBM Journal of Research and Development; vol. 25, No. 4, Jul. 1981.
Programming Language; Yaohan Chu; vol. 8, No. 10, 10/65.
Development and Application of a Designer Oriented Cyclic Simulator; G. J. Parasch; 13th DA Conference 1976.
Logic Synthesis; Melvin A. Breuer; M. Breuer "Design Automation of Digital Systems", Prentice-Hall 1972.
Synthesis of Combinational Logic Networks; D. L. Dietmeyer "Logic Design of Digital Systems"; Allyn & Bacon, Boston 1978.
Quality of Designs from an Automatic Logic Generator (Alert)*; Theodore D. Friedman and Sih-Chin Yang; 7th DA Conference 1970.
On Logic Comparison; Leonard Berman; 18th DA Conference 1981.

(List continued on next page.)

Primary Examiner—Errol A. Krass
Assistant Examiner—Joseph L. Dixon
Attorney, Agent, or Firm—Sughrue, Mion, Zinn, Macpeak, and Seas

[57]  ABSTRACT

Logic is synthesized from a flowchart-level description by first generating an AND/OR logic design, simplifying the AND/OR logic, converting the AND/OR logic to NAND or NOR logic, applying particular sequences of simplifying transformations to the NAND or NOR logic, converting the simplified NAND or NOR logic to a target technology, and simplifying the target technology where possible. The end result is an interconnection of primitives of the target technology in a language from which automated logic diagrams can be produced.

24 Claims, 33 Drawing Figures

OTHER PUBLICATIONS

Automated Exploration of the Design Space for Register-Transfer (RT) Systems: Barbacci Mario Roberto;

The Design and Analysis of an Automated Design Style Selector: Thomas Donald Earl, Jr.

Automation of Module Set Independent Register-Transfer Level Design: Edward Alfred Snow, III.

A new Look at Logic Synthesis; John A. Darringer; 17th DA Conference 1980.

Experiments in Logic Synthesis; John A. Darringer; IEEE ICCC 1980.

Methods used in an Automatic Logic Design Generator (Alert); Theodore D. Friedman; IEEE Transactions on Computers; vol. C-18, No. 7, Jul. 1969.

Register-Transfer Level Digital Design Automation: The Allocation Process; Louis Hafer; 15 DA Conference 1978.

The CMU Design Automation System; An Example of Automated Data Path Design; A. Parker et al.; 16 DA Conference 1979.

Lores-Logic Reorganization System; Shunichiro Nakamura et al.; 15 DA Conference 1978.

Translation of a DDL Digital System Specification to Boolean Equations; James R. Duley and Donald L. Dietmeyer, IEEE Trans. on Comp. vol. C-18. No. 14, '69.

DDL-A Digital System Design Language; James Robert Duley; Ph.D. 1967.

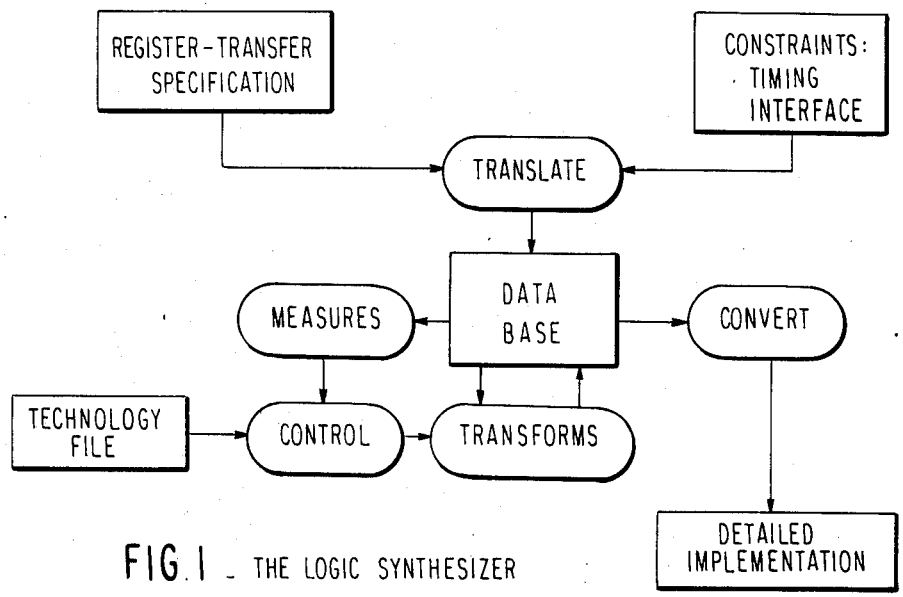
FIG.1 — THE LOGIC SYNTHESIZER
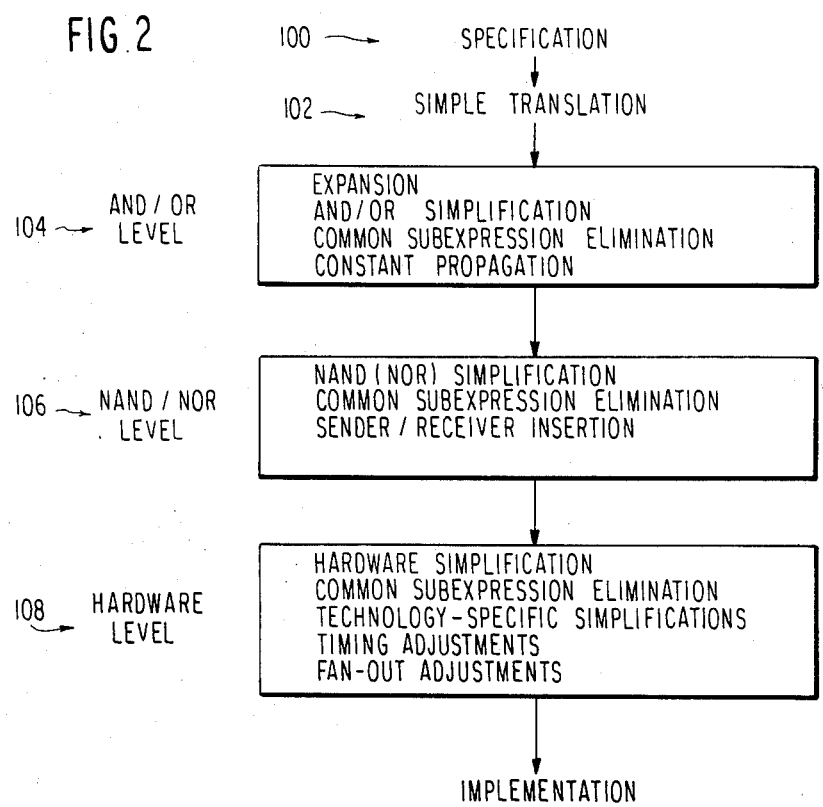
FIG.2

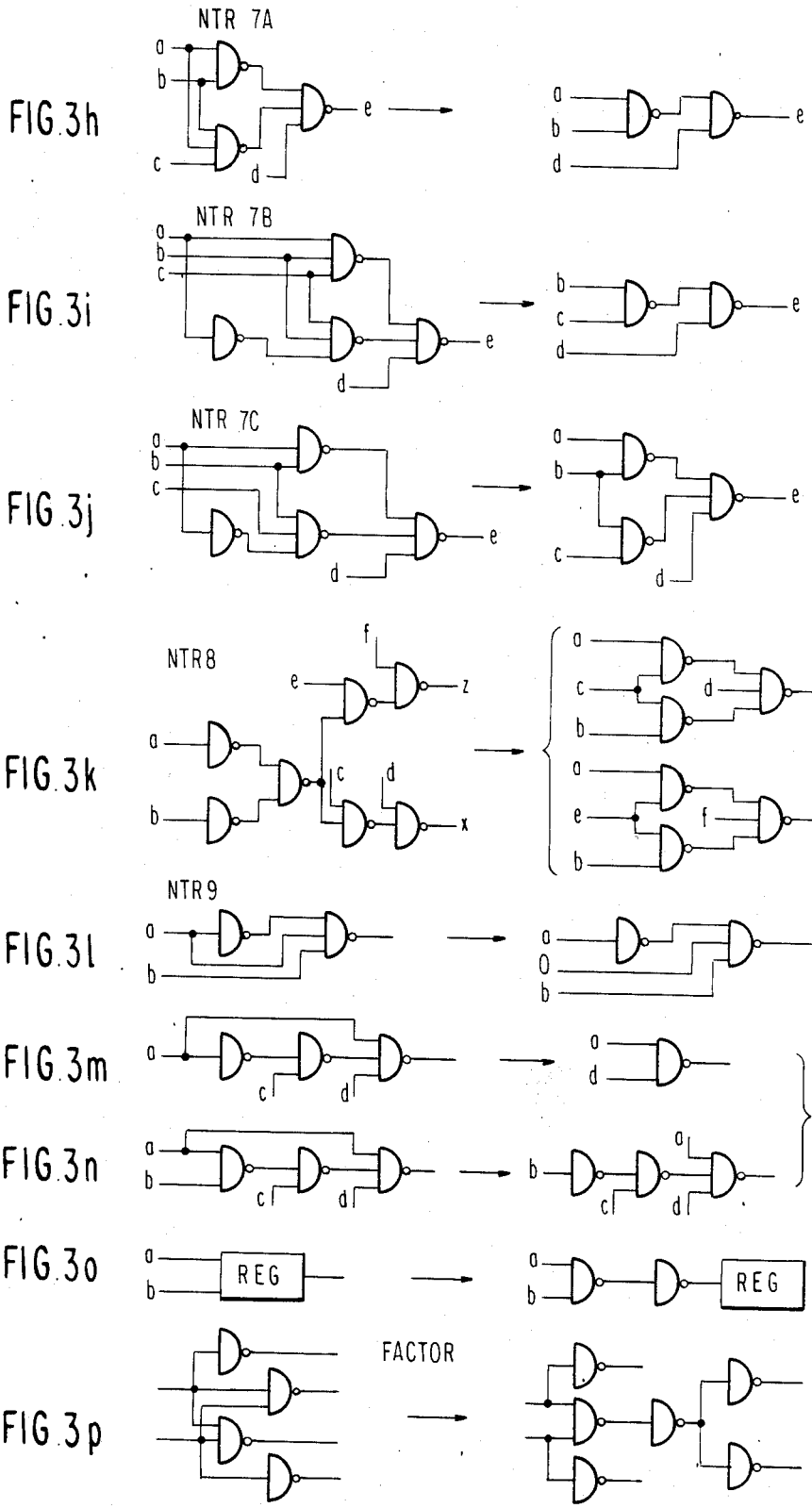

ELIMINATE COMMON TERMS

SIMPLIFY PARITY OPERATORS

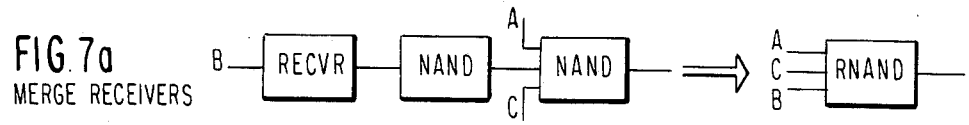
FIG.7a
MERGE RECEIVERS
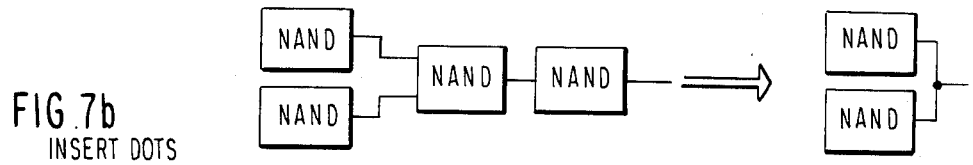
FIG.7b
INSERT DOTS
FIG.7c
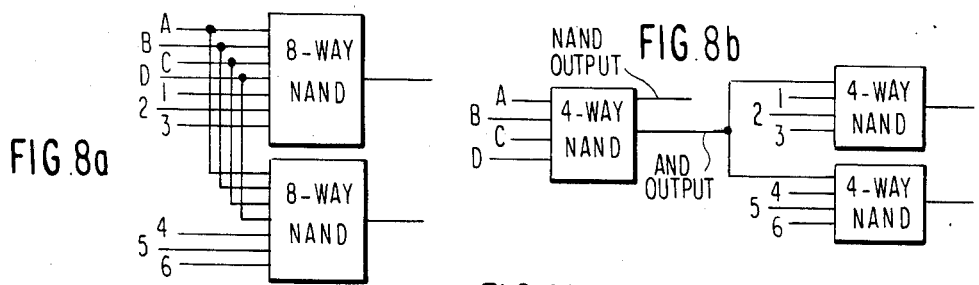
FIG.8a
FIG.8b
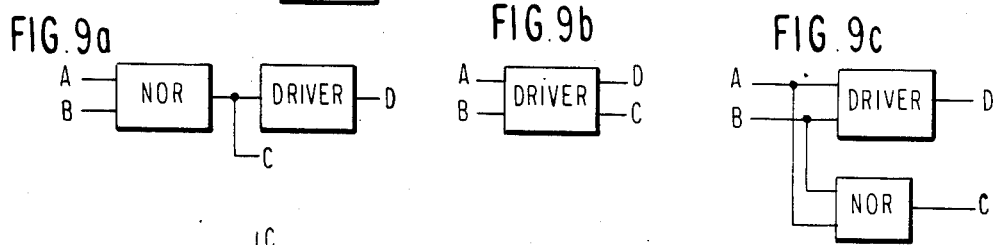
FIG.9a
FIG.9b
FIG.9c
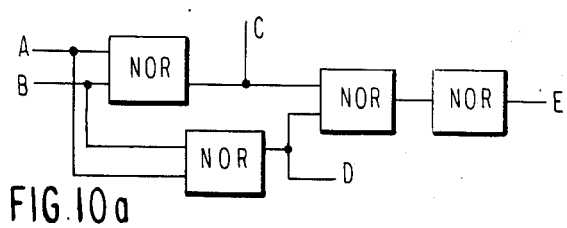
FIG.10a
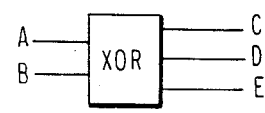
FIG.10b
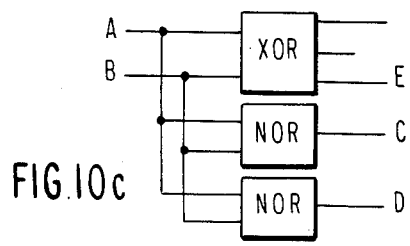
FIG.10c

LOGIC SYNTHESIZER

BACKGROUND OF THE INVENTION

This invention is directed to logic design, and more particularly to a method of automated logic design.

As the complexity of processors has increased, the task of processor logic design has become more difficult. The designer may begin by designing a flow chart or other register-transfer level description to describe the intended operation of the processor, and the processor operation is then simulated from this description in order to ensure that a processor operating in accordance with the flow chart will provide the desired results. A logic implementation is then designed to achieve the operation described in the flow chart, and the resulting logic diagram and original flow chart specification are compared to ensure consistency. Finally, a physical layout is designed in accordance with the logic diagram implementation.

The above process has become significantly more difficult and extraordinarily time consuming with the increasing complexity of the processors being designed. For example, each chip in the 3081 processor available from International Business Machines Corporation includes over 700 circuits capable of performing extremely complex functions. The flow chart specification of such a processor will be quite complex, and even a first attempt at a logic diagram implementation will require a substantial amount of time. Further, with increasing processor complexity, the competing interests of gate count and timing constraints become increasingly difficult to satisfy. More particularly, a typical timing constraint may be that a signal must be provided from the output of register A to the input of register B within some predetermined period of time, and the designer may first propose a logic arrangement intended to satisfy this timing constraint while using a minimal number of gates in the circuit path between registers A and B. After timing analysis, however, it may be discovered that the timing constraint has not been satisfied, and the designer must then revise the arrangement of logic between the registers A and B, e.g., by using a larger number of gates to improve the processing speed in that area. Several iterations of design may be required before a logic design is obtained which indeed satisfies all timing constraints with the minimum gate count, and it is therefore not uncommon for the logic design to be quite costly in terms of engineering time.

In view of the above, there has been significant recent activity in the field of automatic logic synthesis. Early work centered on developing algorithms for translating a boolean function into a minimum 2-level network of boolean primitives, and extensions were developed for handling limited circuit fan-in and alternative cost functions. However, because these algorithms employ 2-level minimization, the time required to implement these algorithms increases exponentially with the number of circuits. The use of such algorithms therefore becomes impractical in designing large processors.

Other efforts have attempted to raise the level of specification, e.g., by beginning with behavioral specifications and producing technology-independent implementations at the level of boolean equations. However, the results of such techniques were usually more expensive than manual implementations and did not take advantage of the target technology. For example, the system described by T.D. Friedman et al, in "METHODS USED IN AN AUTOMATIC LOGIC DESIGN GENERATOR (ALERT)," IEEE Trans. on Computers, Vol. C-18, No. 7 pp. 593–614 (1969), produced an implementation for an IBM 1800 processor which required 160% more gates than the manual design for that processor. Several attempts have been made to produce more efficient logic and to give the designer more control over the implementation, e.g., as described by: H. Schorr, "Toward the Automatic Analysis and Synthesis of Digital Systems," Ph.D. Thesis, Princeton University, Princeton, NJ, 1962; C.K. Mestenyi, "Computer Design Language Simulation and Boolean Translation," *Technical Report* 68–72, Computer Science Department, University of Maryland, College Park, MD, 1968; F.J. Hill and G. R. Peterson, *Digital Systems: Hardware Organization and Control,* John Wiley & Sons, Inc., New York, 1973. However, this control has resulted in specification language constraints, so that the specification is at a fairly low level and in closer correspondence with the implementation. This necessarily decreases the advantage of an automated approach, bringing it closer to a system for logic entry rather than logic synthesis.

Several tools have been developed to support the early part of the design cycle, e.g., as described in: M. Barbacci, "Automated Exploration of the Design Space for Register Transfer Systems," Ph.D. Thesis, Carnegie-Mellon University, Pittsburgh, PA, 1973; D. E. Thomas, "The Design and Analysis of an Automated Design Style Selector," Ph.D. Thesis, Carnegie-Mellon University, Pittsburgh, PA, 1977; E. A. Snow, "Automation of Module Set Independent Register-Transfer Level Design," Ph.D. Thesis, Carnegie-Mellon University, Pittsburgh, PA, 1978; L. J. Hafer and A. C. Parker, "Register-Transfer Level Digital Design Automation: The Allocation Process," *Proceedings of the Fifteenth Design Automation Conference,* Las Vegas, NV, 1978, pp. 213–219; A. Parker, D. Thomas, D. Siewiorek, M. Barbacci, L. Hafer, G. Leive, and J. Kim, "The CMU Desiqn Automation System - An Example of Automated Data Path Design," *Proceedings of the Sixteenth Design Automation Conference,* Las Vegas, NV. 1978, pp. 73–80. The technique described in the last-cited publication began with a functional description of a machine and produced an implementation in two technologies of the registers, register operators and their interconnections, but not the control logic to sequence the register transfers. For both TTL and CMOS implementations, however, the automated implementation required substantially more chip area than existing manual designs.

There has also been recent work in logic remapping, i.e., transforming existing implementations from one technology to another. S. Nakamura et al S. Nakamura, S. Murai, C. Tanaka, M. Terai, H. Fujiwara, and K. Kinoshita, "LORES-Logic Reorganization System," *Proceedings of the Fifteenth Design Automation Conference,* Las Vegas, NV, 1978, pp. 250–260; describe a system which will help a deslgner translate an existing small-or medium-scale integration implementation into large-scale integration. However, remapping usually involves one-to-one substitution of new technology primitives for old technology primitives, and this often fails to take advantage of simplification which may be available at a higher technology-independent level.

SUMMARY OF THE INVENTION

It is therefore an object of the present invention to provide an automated logic synthesis technique which overcomes the above-described drawbacks. It is a more particular object of the present invention to provide such an automated logic synthesis technique which is capable of operating at a relatively high speed while achieving end results comparable to those obtained by manual design. It is a still further object of this invention to provide such an automatic logic synthesis technique capable of achieving satisfactory results in a number of different technologies.

Briefly, these and other objects of the invention are achieved by a logic synthesis method in which a register-transfer level flowchart specification is translated in a straightforward manner into a simple AND/OR logic implementation. After expanding the logic implementation to elementary representation and then applying textbook simplifications, the simplified AND/OR implementation is translated to a NAND or NOR implementation, depending on the target technology. The NAND or NOR implementation is then simplified by applying a sequence of simplification transformations which have been found by the present inventors to achieve satisfactory results, with the transformation sequence being modified to achieve "normal," "fast" or "small" logic designs. After simplification at the NAND/NOR level, the logic implementation is then translated to the target technology and further simplified. The result is an interconnection of the primitives of the target technology in a language from which automated logic diagrams can be produced in a known manner, and which can be submitted to existing programs for automated placement and wiring and chip fabrication.

BRIEF DESCRIPTION OF THE DRAWINGS

The present invention will be more clearly understood from the following description in conjunction with the accompanying drawings, wherein:

FIG. 1 is a conceptual diagram of the logic synthesis technique according to the present invention;

FIG. 2 is a chart illustrating the multiple levels of simplification in the logic synthesis technique according to the present invention;

FIG. 7(a)-7(c) illustrate examples of simplification at the hardware level; and

FIGS. 8(a)-8(b), 9(a)-(c) and 10(a)-10(c) illustrate further examples of technology-specific hardware simplifications.

DETAILED DESCRIPTION OF THE PREFERRED EMBODIMENT

Figure 3A:
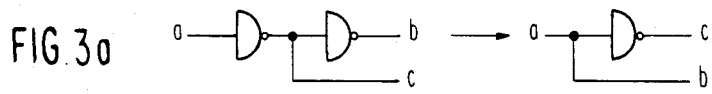
FIGS. 3(a)-3(p) illustrate simplifying transformations at the NAND/NOR level.

The logic synthesis method according to the present invention is generally illustrated in FIG. 1. Previous publications describing some aspects of the system according to this invention, all of which are incorporated herein by reference, are: J. A Darringer and W. H. Joyner, "A New Look at Logic Synthesis," *Proceedings of the Seventeeth Design Automation Conference* Minneapolis, MN, 1980, pp. 543-549; J.A. Darringer, W. H. Joyner, L. Berman, and L. Trevillyan, "Experiments in Logic Synthesis," *Proceedings of the IEEE International Conference on Circuits and Computers ICCC80*, Port Chester, NY, 1980, pp. 234-237A; J. A. Darringer, W. H. Joyner, C. L. Berman and L. Trevillyan, "Logic Synthesis Through Local Transformations," *IBM Journal of Research and Development, Vol.* 25 No. 4, July 1981.

The present invention is an automatic replacement for part of the manual design process. It operates on a logic design at three levels of abstraction. It begins with an initial implementation generated in a straightforward manner from the specification. The implementation can be simplified at this level, and then moved to the next level. This simplification is accomplished by transformations, either locally or globally, to achieve the simplification or refinement. By being able to operate on the implementation at several levels, the system can often make a small change at one level that will cause a larger simplification at a lower level. By using function-preserving transformations, it is ensured that in all cases the implementation produced will be functionally equivalent to the specified behavior. The inputs to the system illustrated in FIG. 1 are a description, in a register-transfer level, flow chart-control language, of logic functions to be implemented on a chip in a specified master slice technology, together with the interface constraints and a technology file which characterizes the target technology. The output of the system is a detailed interconnection of the primitives of the target technology in a language from which automated logic diagrams (ALD's) may be produced and which can be submitted to existing programs for automated placement and wiring and chip fabrication. The output implementation is in terms of the target technology and satisfies technology-specific constraints. Some timing or other physical problems may not be detectable before placement and wiring, and in such cases the synthesis process is repeated with a revised specification or modified constraints until an acceptable implementation is achieved.

The method according to this invention comprises PL/I programs operating on a representation of the logic in a data management system. The data management system is preferably that described by F. E. Allen et al, "THE EXPERIMENTAL COMPILING SYSTEM," IBM Journal of Research and Development, Volume 24 (1980), pages 695-715. The logic synthesis data base uses a single organization component referred to as a "box," with each box having input and output terminals which are connected by wires to other boxes. Each box also is designated by a type, which may be a primitive or may reference a definition in terms of other boxes. Thus, a hierarchy of boxes can be used, and an instance of a high-level box such as a parity box can be treated as a single box or expanded into its next-level implementation when that is desirable.

The logic synthesis data base is made of two groups of tables. The first group describes the technology being used, and is created from a technology file containing, for each box type, information such as name, function and number and names of input and output pins. These data are created in batch mode and read during initialization of the interactive system.

The second group of tables contains the representation of the logic created by the system. This group consists of a box table, a signal table and a set of auxiliary tables which describe the relationship between the boxes and the signals. There is some intentional redundancy in the data, i.e., each box has a complete list of input and output signals and each signal has a source and a list of sinks. Every box table entry contains type information which provides a link to the technology group, thus allowing programs to obtain technology information about a specific box.

Using the system generally illustrated in FIG. 1, a synthesis process according to the present invention may follow the sequence of steps shown in FIG. 2. FIG. 2 illustrates the three essential levels of description used in the method of the present invention: the initial AND/OR level 104, a NAND or NOR level 106 (depending on the target technology), and a hardware level 108 in which the types of the boxes are books or primitives of the target technology. At every level, the implementation is a network of boxes connected by signals. The purpose of this type of implementation is to find a set of transformations and a sequence of applying these transformations such that the original functional specification could be transformed by a sequence of small steps into an acceptable implementation.

Figure 4:
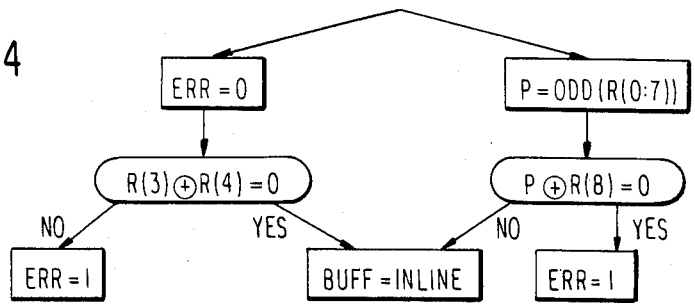
FIG. 4 is a simple illustration of a portion of a flowchart specification from which the present invention begins.
Figure 5A:
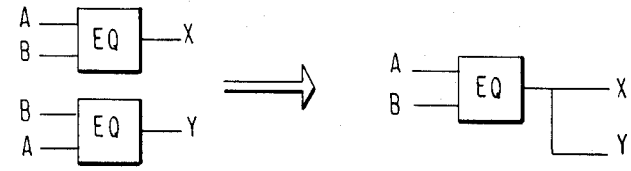
FIGS. 5(a)-(b) illustrate simplifications which may be performed at the AND/OR level.
Figure 5B:
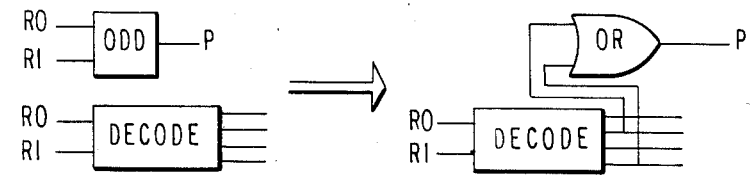

As pointed out above, the process of this invention begins at step 100 with a register-transfer level description e.g. of the type shown in FIG. 4. The description consists of two parts: a specification of the inputs, outputs and latches of the chip to be synthesized; and a flowchart-like specification of control, describing for a single clock cycle of the machine how the chip outputs and latches are set according to the values of the chip inputs and previous values of the latches. At step 102 in FIG. 2, the register-transfer level description undergoes a simple translation to an initial implementation of AND/OR logic. This AND/OR level is produced by merely replacing specification language constructs with their equivalent AND/OR implementations in a well known manner, e.g., as described in J. R. Duley, "DDL - A Digital Design Language," Ph.D. Thesis, University of Wisconsin, Madison, WI, 1968; or J. A. Darringer, "The Description, Simulations and Automatic Implementation of Digital Computer Processors," Ph. D. Thesis, Carnegie-Mellon University, Pittsburgh, PA, 1969. At this first level 104 in FIG. 2, the logic begins in the form of an interconnection of boxes designated by types representing the operations which the perform, e.g., AND, OR, NOT, PARITY, EQ, XOR, DECODE, REGISTER (generic latch), SENDER, RCVR. At step 104 in FIG. 2, the initial AND/OR implementation is first expanded by taking all operators more complex than AND, OR or NOT and replacing these more complex operators with combinations of AND, OR, and NOT. Beginning with this expanded AND/OR logic, simplification is achieved by invoking PL/I program transformations which search for patterns of interconnected primitives and replace them by functionally equivalent patterns which are simpler in that they use fewer instances of operators, fewer connections, etc. The transformations at the AND/OR level 104 are local, textbook simplifications of boolean expressions, most of these simplifications reducing the number of boxes but not producing a normal form. Examples of simplifications are shown in FIGS. 5(a) and 5(b). Some of these transformations are similar to optimizing compiler techniques, e.g., constant propagation (moving "0" or "1" signals through logic blocks), common term elimination (combining blocks which compute the same function), combining nested associativecommutative operators, eliminating single input AND's and OR's, etc. Further examples of transformations used are as follows:

NOT(NOT(a))→a
AND(a, NOT(a))→0
OR(a, NOT(a))→1
OR(a, AND(NOT(a),b ))→OR(a,b)
XOR(PARITY($a_1, \ldots, a_n$), b)→
  PARITY($a_1, \ldots, a_n$, b)
AND (a, 1)→a
OR(a, 1)→1

These transformations may leave fragments of logic disconnected, and this can be cleaned up in a manner similar to the way in which compilers perform dead-code elimination.

After simplification at the AND/OR level 104, the simplified AND/OR implementation is transformed into a NAND or NOR implementation. Whereas AND/OR logic requires the use of multiple different operators in a logic design, NAND or NOR logic requires fewer operators, i.e., in a NAND logic design all logical functions can be implemented using some combination of only NAND gates. Whether a NAND or NOR implementation is produced is dependent upon the primitives available in the target technology. However, the NAND or NOR description is not technology-specific, in that there are no fan-in or fan-out restrictions. (Fan-in refers to the number of signals coming into a box, and fan-out refers to the number of sinks or destinations of a signal.) The transition to these primitives is accomplished naively by local transformations and may introduce unnecessary double NANDs or NORs which will be eliminated later. Also at this point, the chip interface information is used to place generic, i.e., not technology-specific, senders and receivers on the chip inputs and primary outputs, and to insert inverters where necessary to ensure the correct signal polarities. Techniques for accomplishing this transformation are well-known and need not be described here in detail.

At step 106 in FIG. 2, simplifying transformations are applied to each signal in the network. The NAND and NOR transforms are more difficult, and extensive experiments by the present inventors at the NAND/NOR level have resulted in a sequence or "scenario" of transformations which will produce acceptable results. The transformations are local in that they replace a small subgraph of the network (usually five or fewer boxes) with another subgraph which is functionally equivalent but simpler according to some measure. These transformations attempt to reduce the number of boxes of the implementation without increasing the number of connections. To accomplish this, the transformations must check the fan-out of the various signals involved, since this will affect the number of boxes and signals actually removed. Some of the transformations attempt to remove reconvergent fan-out which contributes to untestable stuck faults.

Some of the transformations are applied throughout the network in a number of iterations, preferably until no more transformations apply. FIGS. 3(a)-3(n) illustrate the NAND transformations NTR1 thru NTR10 used in one embodiment of this invention, and the NOR transformations would be identical except for the operator. Each transformation has an associated condition that determines if the replacement will simplify the implementation by reducing boxes or connections. These conditions depend on the fan-out of the intermediate signals and on whether the target technology is assumed to have dual-rail output.

Figure 6:
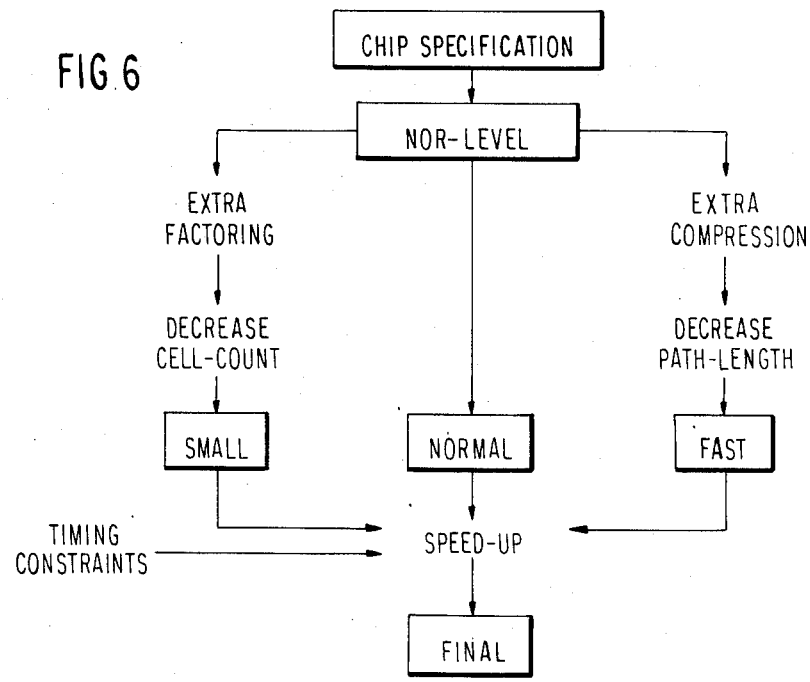
FIG. 6 is a diagram illustrating the different scenarios of simplification at the NAND/NOR level.

Experiments with the NAND/NOR level transformations have resulted in a normal sequence or "scenario," of transformations which have produced acceptable results. A "fast" scenario was developed which resulted in shorter path lengths, and a "small" scenario was also developed to obtain smaller designs. These are generally indicated in FIG. 6. In the preferred embodiment of this invention, the sequence of steps in the normal NAND/NOR scenario would be as follows:

APPLY GENNOR: (or APPLY GENNAND);
UNTIL NOCHANGE APPLY NTR1, NTR2, CLEANUP, NTR3, NTR4, NTR10, CLEANUP, NTR7, NTR9, PROPCON, CLEANUP, CTE, CLEANUP;
FANIN 4;
APPLY NTR6A, FACTORN, NTR6A, CLEANUP;
APPLY NTR10, CLEANUP, NTR7 (NOINCREASE), NTR9, PROPCON, CLEANUP:
APPLY CTE, CLEANUP; FANIN 8:
APPLY NFANIN, NTR11, CLEANUP;

The GENNOR or GENNAND transformations merely transform the AND/OR implementation into either NAND or NOR logic in accordance with the target technology. This type of transformation is well understood in the art and need not be described in detail here.

NTR1 in FIG. 3(a) removes double inverters and always applies, since it is always considered desirable to reduce the number of cells, and because this transformation does not increase connects or path lengths. This transform, and others, may in some instances increase fan out, but the fan out can be reduced, if necessary, at a later point.

Figure 3B:
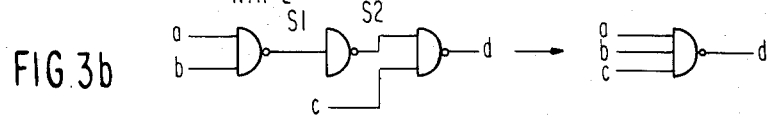

NTR2 in FIG. 3(b) applies only if $s_1$ has no fan out and $s_2$ fans out only to primitives, i.e., either NANDs or NORs. This transform will not apply if it will result in an increase in the number of connects. For example, in the transformation illustrated in FIG. 3(b), gates 10 and 12 are eliminated and their corresponding input and output connections are also eliminated. However, if $s_2$ fans out to four NANDs, it would be necessary to apply the NTR2 transformation to each one, resulting in an increase in the number of connects.

Figure 3C:
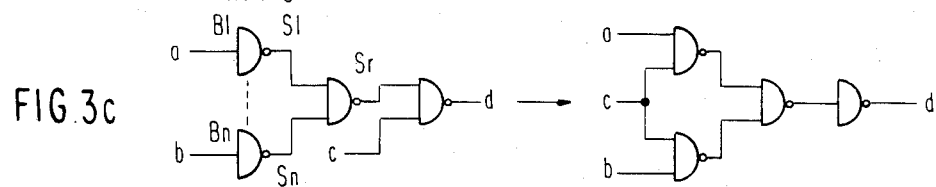

NTR3 in FIG. 3(c) applies only if none of the gate outputs $s_i$ fans out, $s_r$ does not fan out, and no gate $B_i$ exceeds the fan-in threshold for a single-cell book. This helps set up later dotting.

Figure 3D:
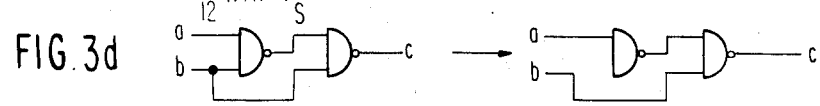

NTR4 in FIG. 3(d) removes redundancy locally. Redundancy is a property of a combinational logic circuit, and is present when the network contains a signal that can be set to a constant value without changing the function of that network. NTR4 also replicates logic if the output s of gate 12 fans out.

Figure 3E:
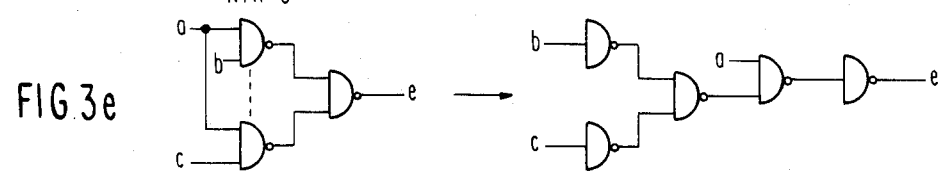
Figure 3F:
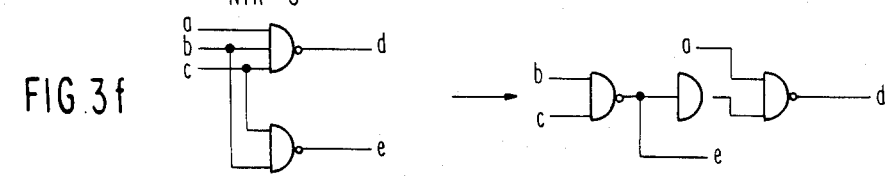
Figure 3G:
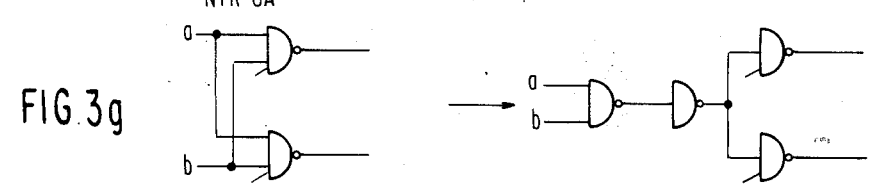

NTR6A in FIG. 3(g) sets up dotting and is only run if dotting is allowed in the target technology.

NTR7 eliminates some forms of redundant connections. This transform will replicate boxes, if necessary, unless the parameter NOINCREASE is specified. NTR7 actually comprises three transforms illustrated in FIGS. 3(h)-3(j), all of which are run each time NTR7 is called for in the above program.

NTR9 in FIG. 3(i) handles cases where a signal and its negation both go to a NOR or NAND gate. The "0" input to gate 14 will be a "1" for the equivalent NOR transformation. This transform should be followed by PROPCON, described below.

NTR10 includes two different transforms illustrated in FIGS. 3(m) and 3(n), both of which are run each time NTR10 is called for. The NTR1O transform is run only if the outputs of gates 18 and 20 and FIG. 3(n) do not fan out.

NTR11 in FIG. 3(o) makes all generic registers (considered to have the OR function) have a fan-in of 1 by preceding each register with an appropriate number of primitives.

PROPCON, CLEANUP and CTE are analogous to the compiler operations of constant propagation elimination, dead-code elimination and common sub-expression elimination, respectively. Common sub-expression elimination, or common term elimination, refers to locating boxes which produce the same logic value, eliminating one box, and sharing the output of the other box.

FANIN 4 does not in itself perform any transformation but instead sets a variable known as "FANIN" to a value of 4.

FACTORN examines only boxes exceeding the FANIN limitations specified by the variable FANIN. It then applies the transformation of FIG. 3(p). This transformation will not reduce all boxes to below the specified FANIN limit, but only those boxes to which it applies by finding common sinks.

NFANIN corrects the fanin to the specified limit by building fanin trees which it constructs to have the fewest boxes and then to lengthen as few paths as possible.

In a NOCHANGE loop, the transformations are repeatedly run in their specified order until no further change in the logic occurs. In general, the order of the transformations and their inclusion in the NOCHANGE loop is such that suceeding transformations are invoked when preceding transformations can cause them to apply. For example, in the first loop, the sequence beginning with NTR9 is used to remove gates having complementary inputs. Since this can produce constant zeros or ones, constant propagation (PROPCON), removal of unconnected boxes (CLEANUP), common term elimination (CTE), and then more CLEANUP (to deal with now-unconnected common terms) must be run. On the other hand, after fan-in correction by factoring and NFANIN, some transformations should not be run, because they may destroy the fan-in limits already enforced.

In looking again at the program above, it can be seen that certain sequences of functions are performed, with some functions comprising a plurality of transformations. More particularly, with regard to the first NOCHANGE loop, transformations NTR1, NTR2, CLEANUP, NTR3 operate to reduce logic depth, i.e., number of levels of logic from input to output, with NTR1 reducing logic depth from two levels to one and NTR2 reducing logic depth from three levels to one. NTR3 at first glance appears to provide no depth reduction, since it transforms three levels of logic to three levels of logic. However, in some instances the last level, gate 11, can be subsequently eliminated, so that NTR3 is often useful in reducing logic depth.

Reducing logic depth, i.e., .compressing the logic into fewer levels, will increase the chance of detecting redundancy. Thus, NTR4, NTR10, CLEANUP, NTR7, NTR9, PROPCON, CLEANUP applied to remove redundancy.

After removing redundancy, a common terms elimination sequence CTE, CLEANUP is run.

After the NOCHANGE loop has finished running, transformations are applied to introduce dot patterns and to reduce fan-in to a specific level. This is accomplished by the step FANIN 4 which sets the fan-in limit to a value of 4, followed by the sequence NTR6A, FACTORN, NTR6A, CLEANUP, which serves to reduce fan-in at the expense of logic depth.

Once again, the introduction of dot patterns and the factoring to reduce fan-in may result in redundancy, so that the redundancy removal sequence NTR10, CLEANUP, NTR7, NTR9, PROPCON, CLEANUP is applied.

Common terms are then eliminated by running CTE, CLEANUP.

Finally, the logic must be adjusted to the maximum fan-in value permitted by the target technology, e.g., a fan-in value of 8. This is achieved by applying FANIN 8 to set the fanin value at 8 followed by NFANIN, CLEANUP.

As should now be appreciated, the above program can be functionally represented as follows:
A. LOGIC DEPTH REDUCTION LOOP
   A1. REDUCE LOGIC DEPTH
   A2. REMOVE REDUNDANCY
   A3. ELIMINATE COMMON TERMS
B. INTRODUCE DOT PATTERNS AND FACTOR TO REDUCE FANIN TO SPECIFIC LEVEL
C. REMOVE REDUNDANCY
D. ELIMINATE COMMON TERMS
E. ADJUST LOGIC TO MAXIMUM PERMITTED FANIN The operations subsequent to the logic depth reduction loop may tend to expand the logic depth, so that the above process can generally be seen as a compression stage followed by an expansion stage. While it may be theoretically possible to obtain maximum logic depth reduction through two-level boolean minimization, this would compress the logic so far that re-expansion to take advantage of other simplifying transformations, e.g., at the subsequent hardware simplification, would be much more difficult. Thus, the logic compression transforms have been found particularly suitable.

The program set forth above concerns a normal scenario, and the "fast" and "small" scenarios can be obtained by modifying the above program as follows: for the small scenario, the following additional NOCHANGE loop is inserted after the NOCHANGE loop in the normal scenario:
UNTIL NOCHANGE APPLY NTR6, NTR5, NTR1, NTR2, CLEANUP, NTR3, NTR4, NTR10, CLEANUP, NTR7, NTR9, PROPCON CLEANUP, CTE, CLEANUP;

NTR5 in FIG. 3(e) applies only if the number of cells does not increase, and NTR6 in FIG. 3(f) applies only if the number of cells is decreased. Inspection of NTR5 and NTR6 shows that they can increase path length, and they are consequently only used in the small scenario. The other transformations in the added loop are provided to act on any changes which may result from NTR5 and NTR6. For example, NTR5 and NTR6 can produce double inverters, so the sequence beginning with NTR1 is run. NTR1 eliminates double inverters, and can introduce situations where other transforms apply.

Examination of the second NOCHANGE loop set forth above will reveal that the loop includes a first sequence NTR6, NTR5 for reducing the cell count by increasing the logic depth. The sequence NTR1, NTR2, CLEANUP, NTR3 is then applied to mitigate the logic depth reduction by taking advantage of transforms made available by NTR6, NTR5. After this logic depth reduction sequence, the redundancy removal and common term elimination sequence are applied in the first NOCHANGE loop.

Thus, the program for the "small" scenario can be written:
A. LOGIC DEPTH REDUCTION LOOP
   A1. REDUCE LOGIC DEPTH
   A2. REMOVE REDUNDANCY
   A3. ELIMINATE COMMON TERMS
A'. CELL COUNT REDUCTION LOOP
   A1'. REDUCE CELL COUNT
   A2'. REDUCE LOGIC DEPTH
   A3'. REMOVE REDUNDANCY
   A4'. ELIMINATE COMMON TERMS
B. INTRODUCE DOT PATTERNS AND FACTOR TO REDUCE FANIN TO SPECIFIC LEVEL
C. REMOVE REDUNDANCY
D. ELIMINATE COMMON TERMS
E. ADJUST LOGIC TO MAXIMUM PERMITTED FANIN While the "small" scenario is designed to emphasize minimization of gate count, the "fast" scenario is designed to emphasize shorter path lengths, sometimes at the expense of gate count. Path length refers to the delay along a path from a signal's source to one of its destinations. Usually, path lengths are measured from registers or primary chip inputs to registers or primary chip outputs. The result can be the number of boxes in the path or the estimated delay of that path in nanoseconds.

The fast scenario inserts a call to NTR8 as the last step run in the first NOCHANGE loop. Immediately thereafter, FANIN is set to a value of 8 rather than 4, and NTR11 is omitted from the last line of the program. The significance of these changes to the program is as follows:

NTR8 in FIG. 3(k) is used in the fast scenario because it shortens paths. This may sometimes be at the expense of cells, however, since some of the boxes shown in FIG. 3(k) may have to be replicated. The factoring to a fanin of 8, also produces shorter paths, but may increase the cell count, e.g., in a dual-rail technology in which a 4-way NOR/OR required one cell and an 8-way required two cells. This will be explained in more detail with reference to FIGS. 8(a) and 8(b).

In a particular technology, there may be a number of different primitives or "books" having different fan-in capabilities, and different books may include different numbers of cells. For example, an 8-way NAND gate may use two cells while a 4-way NAND gate may use one cell. If 8-way NAND gates are used, e.g., to combine ten different inputs in two combinations with four inputs common to each combination, the result may be as shown in FIG. 8(a). Each book would receive seven inputs, and a total of four cells would be used.

If fan-in is limited to a value of 4, the same logic could be implemented as shown in FIG. 8(b) using three 4-way books. Although the number of books has increased, each book includes only one cell, so that the cell count decreases from four to three. However, the cell count decrease is at the expense of increasing the logic depth by one level.

In the "normal" or "small" scenarios, it is worthwhile to set the fan-in value to 4 and to factor in an attempt to take advantage of the cell reduction which may be realized by using the smaller books. In the "fast" scenario, however, the increase in logic depth accompanying the use of the smaller books is unacceptable, and the fanin is instead set to the maximum allowable fan-in after the NOCHANGE loop.

Thus, the simplification program for the "fast" scenario can be functionally described as follows:

LOGIC DEPTH REDUCTION LOOP
  A1. REDUCE LOGIC DEPTH
  A2. REMOVE REDUNDANCY
  A3. ELIMINATE COMMON TERMS
  A4. REDUCE LOGIC DEPTH WHILE INCREASING CELL COUNT
B. INTRODUCE DOT PATTERNS AND FACTOR TO REDUCE FANIN TO MAXIMUM ALLOWED BY TECHNOLOGY
C. REMOVE REDUNDANCY
D. ELIMINATE COMMON TERMS
E. ADJUST LEVEL TO MAXIMUM PERMITTED FANIN

The search strategy for the above transformations is to scarch the interconnected boxes of the date-base in sequence, looking for a pattern to which the transform may apply. The search is done for each transform in an efficient way, e.g., NTR2 searches the entire logic design for a one-input inverter, since this is faster than examining each multi-way NAND or NOR to determine if an inverter precedes or follows it.

After the simplification sequence described above, transformations are applied to the logic to map the NAND or NOR implementation to the target technology, simplify the technology-specific implementation, and enforoe technology-specific restrictions. This is performed at level 108 in FIG. 2. The transformations applied at level 108 may be generally described as follows, although their exact implementation will depend on the target technology Technology-specific transforms may preferably be applied in the following order: first, generic NAND/-NOR gates are mapped to their counterparts in the target technology. If the fan-in of a gate is too high and there is no corresponding primitive in the technology, a tree of primitives must be built to produce the same logical function. REG's, the generic latches, are mapped to the technology-specific latches. In general, the technology-specific latches have a limited number of pins for data values. If more data values are gated into the latch than can be accomodated, extra "ports" must be connected to the latch in a manner prescribed for the technology. SENDER's and RECEIVER's are mapped to their technology-specific counter parts.

Second, if the target technology is dual-rail, dual-rail books are introduced. With both positive and negative phases available from each gate, all inverters (except those on chip inputs) are removed and their output signals connected to the opposite phase of the source of their input signals. Third, technology-specific "tricks" are introduced, e.g., special books, drivers, receivers, etc., which were not known at the time of the generic transformation. These implement certain functions, such as XOR, combinations of driver and logic functions, combinations of receiver and logic funtions, combinations of latch and receiver, etc., using fewer cells than the primitive NAND or NOR implementation. The pattern of technology-specific NAND's or NOR's is searched for and replaced by the appropriate block. In FIG. 7(a), three cells can be replaced with a single NAND in the target technology having a built-in receiver.

If dots, i.e., wired AND's or OR's, are allowed in the target technology, patterns implementing +AND or +OR functions are located. If the inputs of these patterns have no fan-out, the pattern is replaced by a dot, e.g., as shown in FIG. 7(b). Dots can also be introduced to reduce fan-in as shown in FIG. 7(c). After dots are introduced, more special books may be present and are searched for again.

Next, fan-out is adjusted to meet constraints. Fanout limits are specified for technology-specific box types and output pins of those boxes. Fan-out is brought within these limits by replicating the violating box and distributing some of its fan-out to the copy (parallel repowering) or driving some of the fan-out with a repowering +OR or +AND function in front of the violating box (serial repowering). Additional dual-rail books are added after fan-out adjustment, but not so as to violate fan-out constraints.

Next, clock signals are introduced as chip inputs and distributed to the latches of the chip according to technology-specific requirements for clock distribution. Depending on the technology, this requires clock balancing and introduction of special clock drivers.

Next, path lengths back from latch-to-latch and from chip output to chip input are analyzed. Long paths are first shortened by rearranging fan-in and fan-out repowering, introducing dots (even at the cost of cell count), "undoing" factoring transformations performed at a higher level and introducing high-power books. Short paths are then padded to meet minimum path length requirements.

The fan-out adjustment is then repeated to correct fan-out violations which may have resulted from the path length correction.

Finally, scan-in and scan-out pins are introduced and the latches are linked together in an LSSD scan ring. A chip-in-place test and/or inhibit signals are introduced for chip outputs where required. Since this may introduce fan-out violations, fan-out adjustment is repeated.

An example of a hardware conversion and simplification program for a NOR technology following the above-described sequence may be as follows:

APPLY GENHW, CLEANUP;
APPLY DUAL (NO LIMIT), CLEANUP;
APPLY OPTDRIVE (SMALL OR FAST), CLEANUP,
OPTXOR (SMALL OR FAST), CLEANUP;
APPLY GENDOT;
APPLY OPTDRIVE (SMALL OR FAST), CLEANUP, OPTXOR (SMALL OR FAST), CLEANUP;
APPLY FANOUT, DUAL, CLEANUP;
APPLY CLOCK;
APPLY TIMINE;
APPLY FANOUT, DUAL, CLEANUP
APPLY SCANP, FANOUT;

GENHW maps generic gates to hardware primitives. Since fan-in has been adjusted at the end of the NAND/NOR simplification, much of this step is merely one-to-one mapping.

DUAL removes necessary inverters in dual-rail technologies by absorbing the inverters into other gates which already have positive and negative phases available. This transform will normally be applied so as to exceed the fan-out limit. However, with the NOLIMIT option this transform will always apply.

OPTDRIVE takes advantage of a technology-specific book available, i.e., a driver book with built-in NOR capability. As shown in FIG. 9(a), the logic design may at this point include a NOR gate with a branched output with one branch going to a driver. Since both functions can be served by a single book in the target technology, the arrangement of FIG. 9(b) can be substituted. However, while this may be desirable in "normal" and "small" scenarios, there is a sacrifice in speed. Thus, for a "fast" scenario, the transformation is to the arrangement shown in FIG. 9(c) which provides for "parallel" operation and therefore higher speed at the expense of cell count.

OPTXOR takes advantage of a further technologys-pecific book, i.e., the XOR book. This transformation searches for a pattern of NOR gates providing the XOR function, e.g., as shown in FIG. 10(a), and substitutes the XOR book as shown in FIG. 10(b). Again, however, the transformation to FIG. 10(c) is employed in the "fast" scenario.

GENDOT introduces dotting in such a manner as to both eliminate gates and reduce fan-in. E.g., the transformation shown in FIG. 7(b) will eliminate gates 15 and 16 while the transformation shown in FIG. 7(c) will not eliminate gate 17 but will reduce the fan-in to that gate. This may save cells by permitting the use of a smaller book in the target technology and by allowing other transforms to apply. Since GENDOT changes the logic, OPTDRIVE and OPTXOR are applied again to search for more special books which may now exist.

FANOUT is applied to reduce the fan-out to the allowed limit. Note that the first half of the above hardware level simplification program is run without regard to fan-out limitations, as even the DUAL transform is applied with its NOLIMIT option. The various transformations may have caused fan-out violations which should be corrected by applying FANOUT in the manner discussed above. DUAL is then applied again, but this time so as not to violate fan-out constraints.

CLOCK is applied to distribute clock signals according to technology specific requirements in a manner known in the art.

TIMING is applied to correct path lengths by rearranging fan-in and fan-out trees, introducing more dots and chaning power levels to shorten long path lengths, and inserting pad logic to lengthen the short paths, as necessary. After TIMING is applied, fan-out adjustment is again performed to correct any violations which may have resulted from the timing correction, and DUAL is again run, within fan-out constraints, to take advantage of changes made during fan-out adjustment.

Finally, SCANP is applied to link the registers in a LSSD scan path. Fan-out is again adjusted to correct any violations which may have resulted from SCANP.

The logic synthesis system of this invention employs three different levels of simplification between the original specification and the final implementation: high level simplifications, NAND/NOR level simplifications and technology specific simplifications. Several of the transforms at the three different levels are analogous, differing only in the types of boxes to which they apply, so that simplifications not made at one level would be caught later. This may appear redundant, but the application of transforms as early as possible reduces the size of the implementation and helps prevent a greater explosion in size when, e.g., conversion to NANDs takes place.

A significant advantage of the present invention resides in its adaptability to more than one technology, requiring modifications to only a part of the system and leaving the technology-independent portions intact. This makes the synthesis process according to the present invention useful in synthesizing logic in a number of different technologies, and in fact facilitates the remapping from one technology to another in an efficient manner. Rather than merely mapping hardware primitives one-to-one from one technology to another, a first technology implementation is abstracted to a technology-independent level, e.g., from a TTL chip implementation to a NAND level implementation with generic registers, drivers and receivers. The NAND implementation can be mapped to a NOR level implementation in a straight-forward manner, with the NOR level simplification being performed in the manner described above with reference to level 106 in FIG. 2. The hardware mapping and simplification can then be performed in the manner described with reference to level 108 in FIG. 2. This enables the remapping to take advantage of simplifications which may be available at the NOR level.

Some of the work described in the earlier-cited publications concerned a synthesis process beginning with a behavioral description and producing technology-independent implementations of boolean equations. These processes did not take advantage of the target technology. Other work has centered on the synthesis of the data-flow portion of a machine, synthesis from a high-level behavioral description to a register-transfer description, and implementation of control logic in microcode or programmable logic arrays. In contrast, the present invention provides the following significant features:

First, the present invention uses local transformations at several levels of description, passing through technologyindependent levels of description to a technology-specific description. This enhances the simplification while also facilitating the re-implementation of a design in a different technology.

Second, the specific sequences of simplifying transformations and the conditions associated with them have been found to provide acceptable results in normal, fast and small scenarios, thus making automated logic synthesis practical.

Further, timing, driver and other interface constraints are used at the hardware level to generate logic meeting these requirements.

Still further, the automated logic synthesis process according to the present invention greatly facilitates timing analysis and correction of the design to remove path length problems.

What is claimed is:

1. An automated logic synthesis method of designing, on a computer, a logic circuitry implementation in a desired technology from input data to said computer comprising a description of operating characteristics to be provided by said logic circuitry, said method comprising the steps of:
   generating, via said computer, a first logic circuit design in a first logic system in accordance with said description;
   simplifying said first logic design via said computer;

converting, via said computer, said simplified first logic design to a second logic design in a second logic system requiring fewer different logic operators than said first logic system, said second logic system comprising a plurality of interconnected cells and performing equivalent functions;

simplifying, via said computer, said second logic design, said step of simplifying said second logic design comprising the steps of: applying a depth reduction sequence of logic transformations for reducing the depth of said second logic design; and subsequently applying a size reduction sequence of logic transformations for reducing the size while possibly increasing the depth of said second logic design; and converting, via said computer, said simplified second logic design to said desired technology.

2. A method as defined in claim 1, wherein said step of applying said depth reduction sequence of logic transformations comprises: applying a first logic transformation set for reducing logic depth; applying a second logic transformation set for reducing redundancy; and applying a third logic transformation set for eliminating common terms.

3. A method as defined in claim 2, wherein said step of applying said size reduction sequence of logic transformations comprises: applying a fourth logic transformation set for reducing logic size while possibly increasing logic depth; applying a fifth logic transformation set for reducing redundancy; and applying a sixth logic transformation set for eliminating common terms.

4. A method as defined in claim 3, wherein said second and fifth logic transformation sets include at least one common logic transformation. said common logic transformation being applied in said depth reduction sequence regardless of whether said common logic transformation will increase the number of cells in said second logic design and being applied in said size reduction sequence only if it will not result in an increase in said number of cells.

5. A method as defined in claim 2, wherein said step of applying said depth reduction sequence of logic transformations further comprises applying a fourth logic transformation set (e.g.. NTR8), following said third logic transformation set, for further reducing said logic depth while increasing the number of cells in said second logic design.

6. A method as defined in claim 3, wherein said converting step comprises converting said simplified second logic design to a hardware logic design in said desired technology represented as a plurality of hardware primitives. said method further comprising the step of simplifying said hardware design, said hardware simplifying step comprising:

applying a first hardware transformation set for substituting technology-specific books for predetermined patterns of said hardware primitive;

dotting signal lines to decrease the number of components in said hardware logic design, and to decrease fan-in in some portions of said hardware logic design even if the number of components in said portions is not decreased;

applying said first hardware transformation set;

correcting fan-out in said hardware logic design to a desired value;

adjusting path lengths in said hardware logic design; and correcting fan-out to said desired value.

7. A method as defined in claim 1, wherein said step of applying said size reduction sequence of logic transformations comprises applying a first logic transformation (e.g., FACTORN) for reducing a fan-in characteristic of some portions of said second logic design in accordance with a first fan-in value.

8. A method as defined in claim 1, further comprising the step of applying a cell reduction sequence of logic transformations for reducing the number of cells in said second logic design, said cell reduction sequence being applied between said depth reduction and size reduction sequences.

9. A method as defined in claim 8, wherein said cell reduction sequence of logic transformations includes a first set of logic transformations followed by a second set of logic transformations, said second set of logic transformations comprising said depth reduction sequence of logic transformations.

10. A method as defined in claim 8, wherein said desired technology has a maximum allowable fan-in value, said step of applying said size reduction sequence of logic transformations comprising applying a first logic transformation (e.g., FACTORN) for reducing a fan-in characteristic of some portions of said second logic design in accordance with a desired fan-in value less than said maximum allowable fan-in value.

11. A method as defined in claim 10, further comprising the step of correcting the fan-in characteristics of said second logic design in accordance with said maximum allowable fan-in value subsequent to application of said size reduction sequence of logic transformations.

12. A method as defined in claim 1, wherein said depth reduction sequence of logic transformations is applied a plurality of times prior to applying said size reduction sequence of logic transformations.

13. A method as defined in claim 1, wherein said first logic design is implemented in AND/OR logic and said second logic design is implemented in NAND logic.

14. A method as defined in claim 1, wherein said first logic design is implemented in AND/OR logic and said second logic design is implemented in NOR logic.

15. An automated logic synthesis method of designing, on a computer, a logic circuitry implementation in a desired technology from input data to said computer comprising a description of operating characteristics to be provided by said logic circuitry, said method comprising the steps of:

generating, via said computer, a first logic circuit design in a first logic system in accordance with said description;

simplifying said first logic design via said computer;

converting, via said computer, said first logic design to a second logic design in a second logic system requiring fewer different logic operators than in said first logic design, said second logic design comprising a plurality of interconnected cells and performing equivalent functions as said first logic design;

simplifying said second logic design via said computer;

converting, via said computer, said simplified second logic design to a hardware design in said desired technology comprising a plurality of interconnected hardware components; and simplifying said hardware design via said computer, said step of simplifying said hardware design comprising: applying a first hardware transformation set for substituting technology specific components for predetermined patterns of said hardware;

dotting signal lines via said computer, to decrease the number of components in said hardware logic design and to decrease fan-in in some portions of said hardware logic design even if the number of components is said portions is not decreased;

adjusting path lengths in said hardware logic design via said computer; and correcting fan-out in said hardware logic design to a desired value via said computer.

16. A method as defined in claim 15, wherein said step of simplifying said hardware design further comprises applying said first hardware transformation set again after said dotting step but before said adjusting step.

17. A method as defined in claim 16, wherein said step of simplifying said hardware logic design further comprises the step of correcting said fan-out in said hardware logic design after said second application of said first hardware transformation set and before said adjusting step 18. A method as defined in claim 15, wherein said hardware logic design includes inverters receiving and inverting outputs from associated components, and wherein, when said desired technology is a dual-rail technology, said step of simplifying said hardware design further comprises the step of applying a dual-rail transformation for removing some of said inverters by substituting for said inverter and opposite-phase output signal available from its associated component, said dual-rail conversion transformation being applied both prior to said step of applying said first hardware transformation and subsequent to said step of correcting fan-out.

19. A method as defined in claim 18, wherein said dual-rail conversion transformation is applied prior to said step of applying said first hardware transformation without regard to the effect of said dual-rail conversion transformation on fan-out characteristics of said hardware logic design, said dual-rail conversion transformation being applied after said step of correcting fan-out only to the extent that application of said dualrail conversion transformation will not result in fan-out exceeding said desired value.

20. A method as defined in claim 15, wherein said hardware logic design includes inverters receiving and inverting outputs from associated components, and wherein, when said desired technology is a dual-rail technology, said step of simplifying said hardware design further comprises the step of applying a dual-rail comversion transformation, prior to said step of applying said first hardware transformation, for removing some of said inverters by substituting for said some inverters an oppositephase output available from their associated components.

21. A method as defined in claim 20, wherein said step of simplifying said hardware design further comprises the step of applying said dual-rail conversion transformation subsequent to said step of correcting fan-out.

22. A method as defined in claim 21, wherein said dual-rail conversion transformation is applied prior to said application of said first hardware transformation without regard to the effect of said dual-rail conversion transformation on fan-out characteristics of said hardware logic design, and is applied subsequent to said step of correcting fan-out only to the extent that application of said dual-rail conversion transformation will not result in fan-out exceeding said desired value.

23. An automated logic synthesis method of designing, on a computer, a logic circuitry implementation in a desired technology from input data to said computer comprising a description of operating characteristics to be provided by said logic circuitry, said method comprising the steps of:

generating a first logic circuit design via said computer, in accordance with said description;

simplifying said first logic design via said computer;

converting, via said computer, said first logic design to a second logic design in a second logic system requiring fewer different logic operators than in said first logic design;

simplifying said second logic design via said computer;

converting, via said computer, said simplified second logic design to a hardware design in said desired technology comprising a plurality of interconnected hardware components and including inverters for receiving and inverting output signals from associated ones of said components; and simplifying said hardware design via said computer, said step of simplifying said hardware logic design comprising: applying a dual-rail conversion transformation for removing some of said inverters by substituting for said some inverters an opposite phase output signal available from their associated components, said dual-rail conversion transformation being applied without regard to the effect on fan-out characteristics of said hardware logic design; applying a first hardware transformation set for substituting technology-specific components; dotting signal lines in said hardware logic design; adjusting path lengths in said hardware logic design; correcting fan-out in said hardware logic design to a desired value; and applying said dual-rail conversion transformation only to the extent that it does not result in a fan-out exceeding said desired value.

24. An automated logic synthesis method of designing, on a computer, a logic circuitry implementation in a desired technology from input data to said computer comprising a description of operating characteristics to be provided by said logic circuitry, said method comprising the steps of:

generating, via said computer, a first logic circuit design accordance with said description;

simplifying said first logic design via said computer;

converting, via said computer, said first logic design to a second logic design in a second logic system requiring fewer different logic operators than in said first logic design;

simplifying said second logic design via said computer;

converting, via said computer, said simplified second logic design to a hardware design in said desired technology comprising a plurality of interconnected hardware components; and simplifying said hardware design via said computer, said step of simplifying said hardware logic design comprising selectively applying first first or second hardware transformation sets for substituting technology-specific components for predetermined patterns of said hardware components, said first hardware transformation set resulting in fewer components than said second hardware transformation set and said second hardware transformation set resulting in higher-speed logic than said first hardware transformation set.

* * * * *